(12) United States Patent
Wang et al.

(10) Patent No.: US 7,276,782 B2
(45) Date of Patent: Oct. 2, 2007

(54) PACKAGE STRUCTURE FOR SEMICONDUCTOR

(75) Inventors: Billy Wang, Hsin Chu (TW); Jonnie Chuang, Pan Chiao (TW); Chi-Wen Hung, Chung Li (TW); Chuan-Fa Lin, Shu Lin (TW)

(73) Assignee: Harvatek Corporation, Hsin Chu (TW)

( * ) Notice: Subject to any disclaimer, the term of this patent is extended or adjusted under 35 U.S.C. 154(b) by 0 days.

(21) Appl. No.: 11/011,133

(22) Filed: Dec. 15, 2004

(65) Prior Publication Data

US 2005/0139855 A1    Jun. 30, 2005

Related U.S. Application Data

(63) Continuation-in-part of application No. 10/697,610, filed on Oct. 31, 2003, now Pat. No. 6,885,037.

(51) Int. Cl.
*H01L 23/495* (2006.01)
(52) U.S. Cl. .................. 257/676; 257/98; 257/99; 257/100; 257/E33.056; 257/E33.057; 257/E33.058; 257/E33.059
(58) Field of Classification Search ............... 257/99, 257/98, 100, 676
See application file for complete search history.

(56) References Cited

U.S. PATENT DOCUMENTS 6,060,729 A * 5/2000 Suzuki et al. ............... 257/99
6,066,861 A * 5/2000 Hohn et al. ................. 257/99
6,121,637 A * 9/2000 Isokawa et al. ............. 257/99
6,180,962 B1 * 1/2001 Ishinaga ..................... 257/99
6,198,220 B1 * 3/2001 Jones et al. ................ 313/512
6,274,890 B1 * 8/2001 Oshio et al. ................ 257/98
6,608,334 B1 * 8/2003 Ishinaga .................... 257/100
6,710,377 B2 * 3/2004 Shimomura ................ 257/99
6,847,116 B2 * 1/2005 Isokawa .................... 257/736
6,869,813 B2 * 3/2005 Okazaki .................... 438/22
2003/0107316 A1 * 6/2003 Murakami et al. .......... 313/512
2003/0116838 A1 * 6/2003 Wu ........................... 257/678

* cited by examiner

Primary Examiner—Minhloan Tran
Assistant Examiner—Eduardo A. Rodela
(74) Attorney, Agent, or Firm—Troxell Law Office, PLLC (57) ABSTRACT

A package structure for a semiconductor is described. The advantages thereof are that it has a great structural strength and when being penetrated by light, it will not be influenced by external light and can condense the light. Therefore, it is not easily be deformed so that the yield and quality of package can be increased, and when packaging an LED chip, it easily meets the package requirements of an electronic chip. In addition, the substrate structure is cheaper than the prior art, because a double-layered substrate is employed to improve the strength, and the package structure is also preferred because an external frame device is additionally used for preventing interference by external light. The package structure for the semiconductor has a substrate, an external frame device and a polymer filler.

16 Claims, 7 Drawing Sheets

PACKAGE STRUCTURE FOR SEMICONDUCTOR

CROSS-REFERENCE TO RELATED APPLICATIONS

This application is a Continuation-in-Part of application Ser. No. 10/697,610, filed 31 Oct. 2003 now U.S. Pat. No. 6,885,037, and entitled IC PACKAGE WITH STACKED SHEET METAL SUBSTRATE.

BACKGROUND OF THE INVENTION

1. Field of the Invention

The present invention is related to a package structure for a semiconductor or a light-emitting diode (LED), which advantageously has a great structural strength and is not influenced by external light. Therefore, it is not easily deformed so that the yield and quality of a package can be increased, and, when packaging an LED chip, it easily meets electronic chip packaging requirements. In addition, the substrate structure is preferred and cheap, compared to the prior art, because a double-layered substrate is employed to improve the strength thereof, and the package structure is also preferred, compared to prior art, because an external frame device is additionally used for preventing an interference of external light.

2. Description of Related Art

In the package industry, attention-getting semiconductor packages, particularly light-emitting diode (LED) packages and photo-detector packages, have become increasingly important with electronic products getting smaller and smaller and having a high performance. Furthermore, the LED packaging technology or semiconductor package industry also has weeded through the old to bring forth the new, such as 2 pin and 4 pin LEDs conforming to side mount technology (SMT). In particular, a higher pin count requires better materials in the package structure. Similarly, the illumination of the finished package is also important.

As is well known in the art, the electronic construction technology means that after the semiconductor and LED have been finished, they are assembled in a connection structure with other electronic elements so as to form an electronic product and achieve all procedures of a particular designed function. Mainly, the electronic construction has four functions: power distribution, signal distribution, heat dissipation and protection and support, which are usually used in the IC chip package and LED package.

Figure 1A:
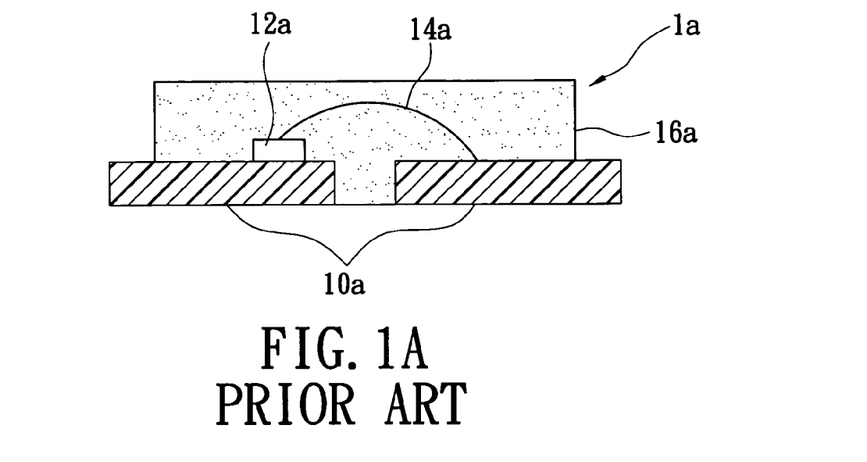
FIG. 1A shows a first schematic view of a conventional LED package structure.
Figure 1B:
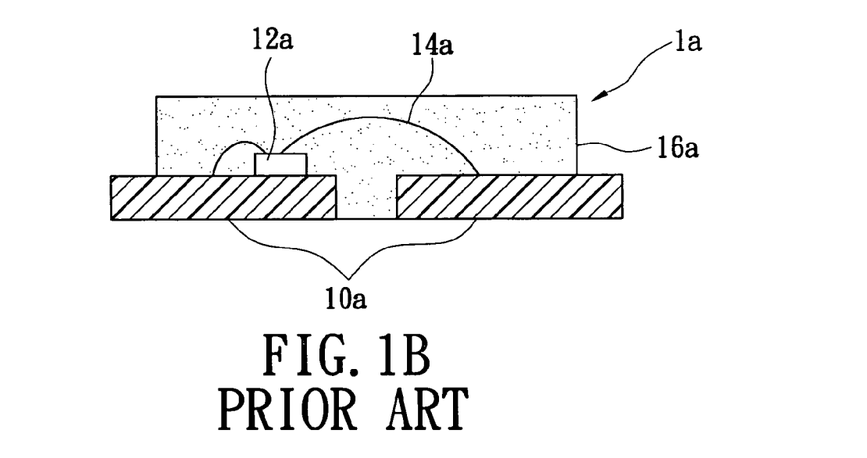
FIG. 1B shows a second schematic view of a conventional LED package structure.
Figure 1C:
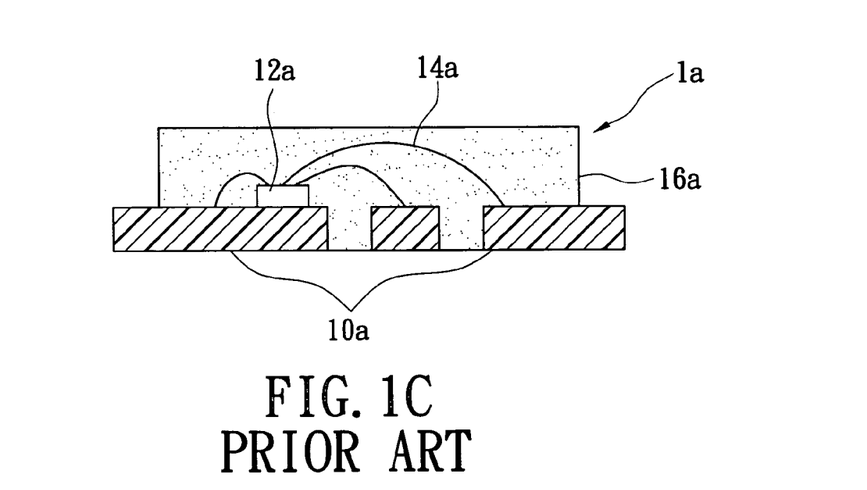
FIG. 1C shows a third schematic view of a conventional LED package structure.

Reference is made to FIGS. 1A to 1C, showing a conventional LED package structure 1a, in which a substrate 10a is attached by an LED chip 12a, connected by a conducting line 14a, and packaged by a packaging material 16a (which may have several trenches). However, when assembling, this conventional LED package structure 1a has a difficulty in structural strength and illumination, e.g., a deformation of the structure when cutting the substrate (which always happens because the substrate is too thin). In practice, this situation may influence the precision and also may negatively influence the package yield.

SUMMARY OF THE INVENTION

The primary object of the present invention is to provide an LED package structure having a great structural strength and capable of maintaining a high illumination for use as a light emitter such as, for example, an LED commonly packaged with a substrate. Thus, the package is cheap and high in quality.

For achieving the object described above, the present invention provides a structure based on a multi-layered substrate and an external frame device. Further, present invention is developed in cooperation with conventional package manufacturing procedures and peripheral equipment.

The structure of the present invention includes a substrate having an obverse side and a reverse side; a semiconductor disposed on the obverse side or the reverse side of the substrate; an external frame device made of an opaque material and mounted on the substrate to surround the semiconductor; and a polymer filler pervious to light and filling the interior of the external frame device.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF PREFERRED EMBODIMENTS

Figure 2A:
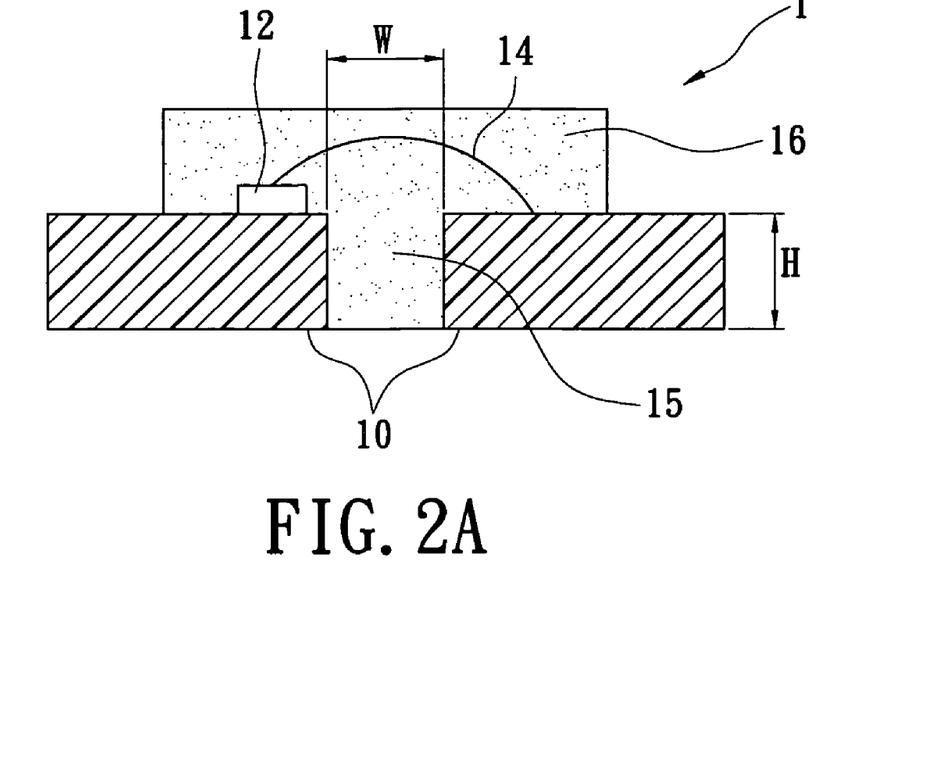
FIG. 2A shows a cross-sectional drawing of an embodiment according to the present invention.
Figure 2B:
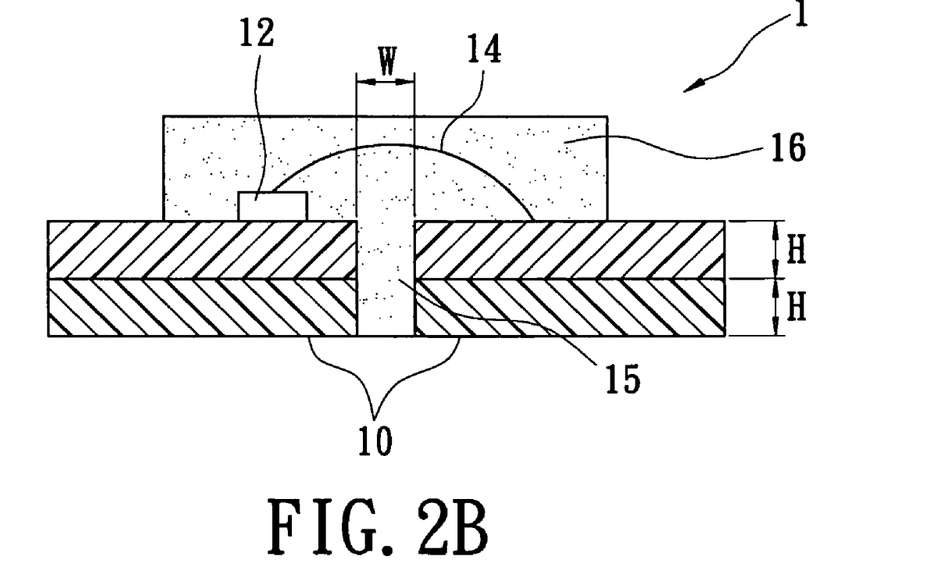
FIG. 2B shows a cross-sectional drawing of an embodiment according to the present invention.

Reference is made to FIGS. 2A to 2B, in which the interval (at the center of a substrate 10) is W and the thickness of the substrate is H. H is proportional to W, which means, as shown in FIG. 2A, when the thickness is reduced, the interval also is reduced. W can be equal to H of each substrate 10. Furthermore, as with the stack structure shown in FIG. 2B, when the thickness is reduced to half, the interval can be very small to as to reduce the interval and strengthen the substrate. Therefore, in accordance with the relationship between H and W described above, the structure of the stack can be adjusted according to actual requirements.

Reference is made to FIGS. 3A to 3B, FIG. 4, and FIGS. 5A to 5E showing embodiments of the present invention.

Figure 3A:
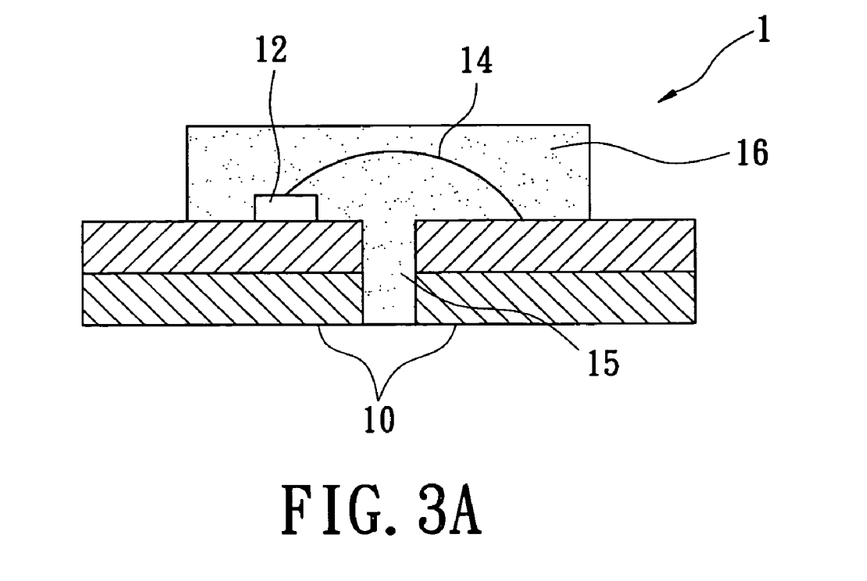
FIG. 3A shows a cross-sectional drawing of a stack embodiment according to the present invention.
Figure 3B:
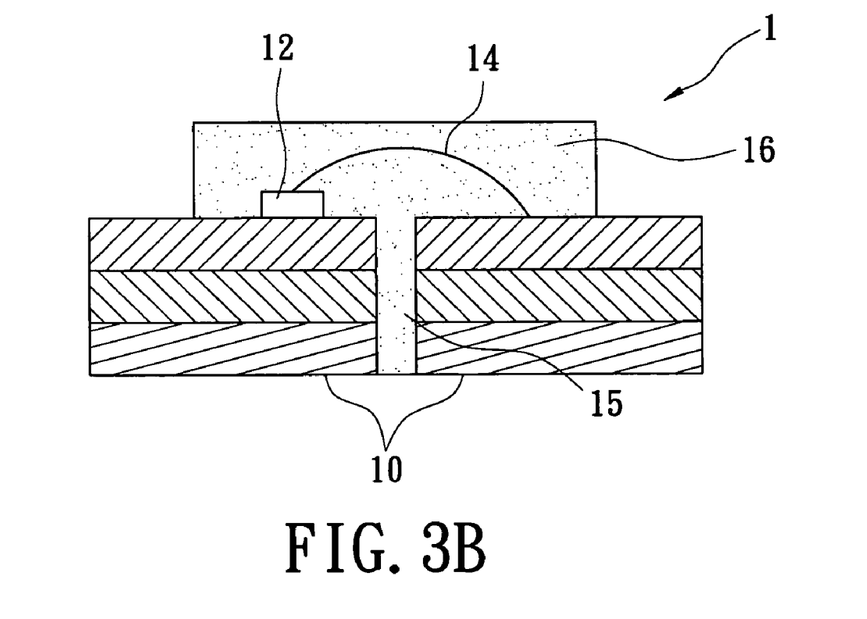
FIG. 3B shows a cross-sectional drawing of a stack embodiment according to the present invention.
Figure 4:
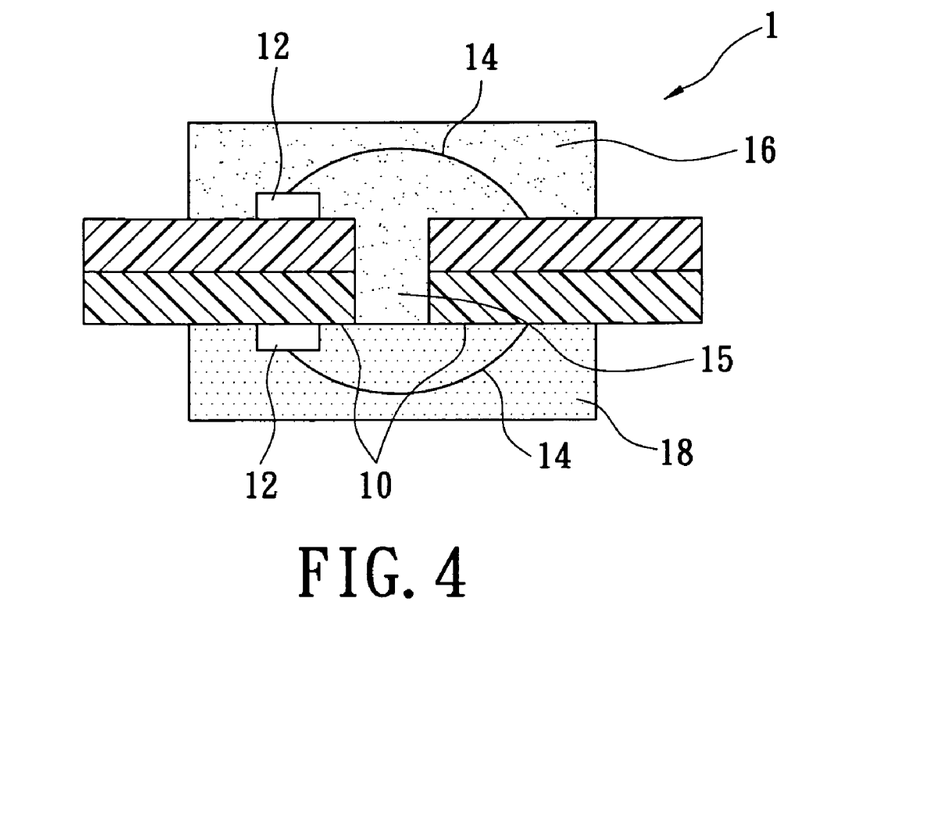
FIG. 4 shows a cross-sectional drawing of a two-sides embodiment according to the present invention.
Figure 5A:
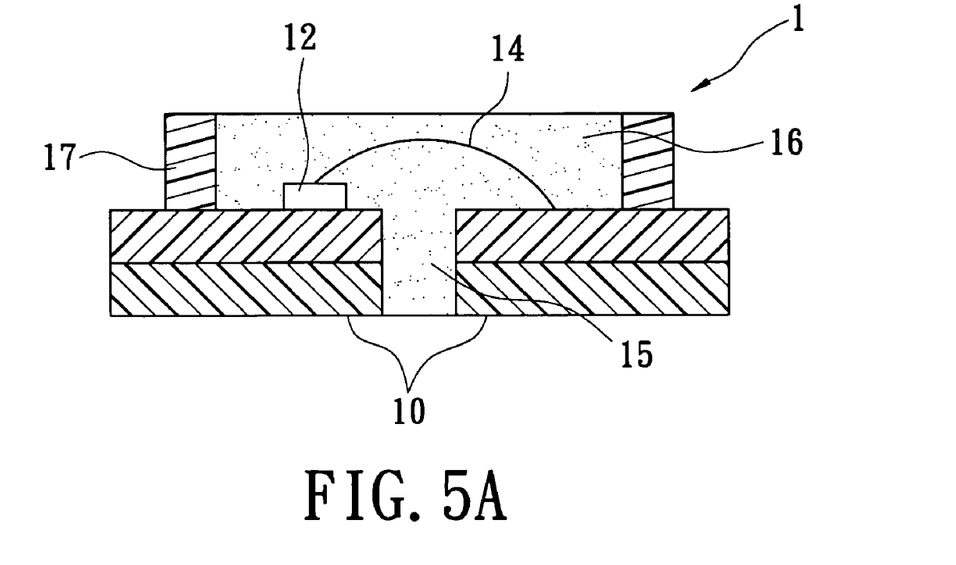
FIG. 5A shows a cross-sectional drawing of another embodiment according to the present invention.
Figure 5B:
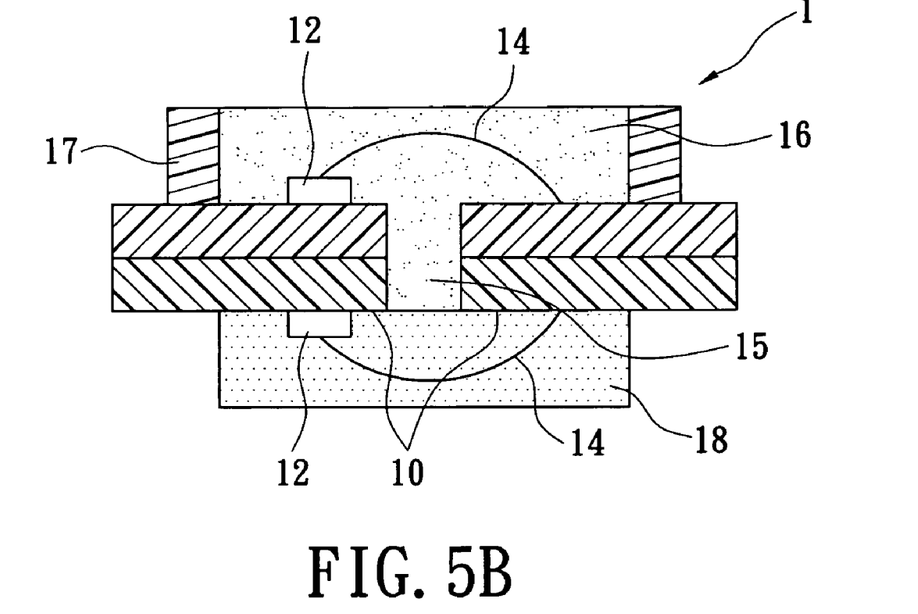
FIG. 5B shows a cross-sectional drawing of a further embodiment according to the present invention.
Figure 5C:
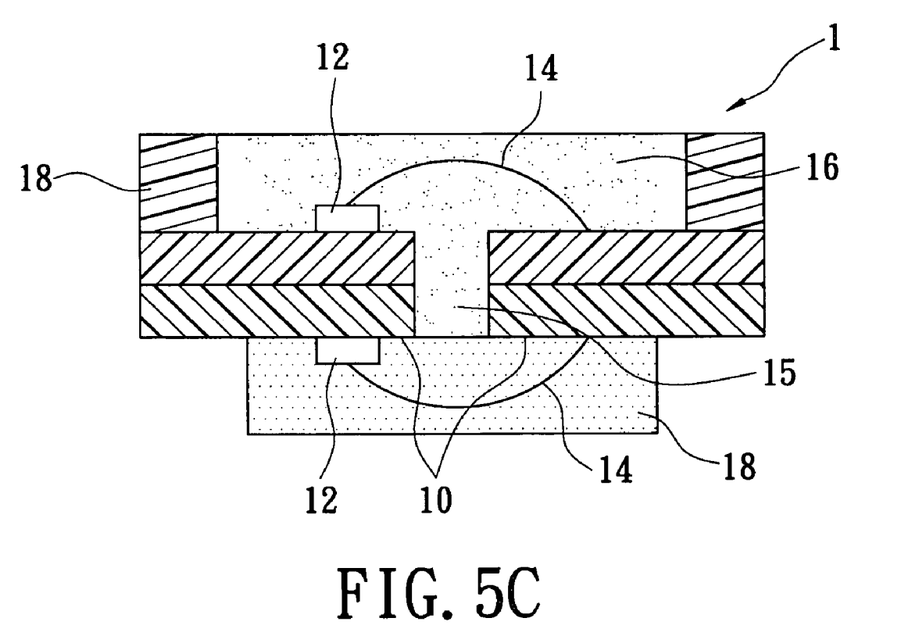
FIG. 5C shows a cross-sectional drawing of a further another embodiment according to the present invention.
Figure 5D:
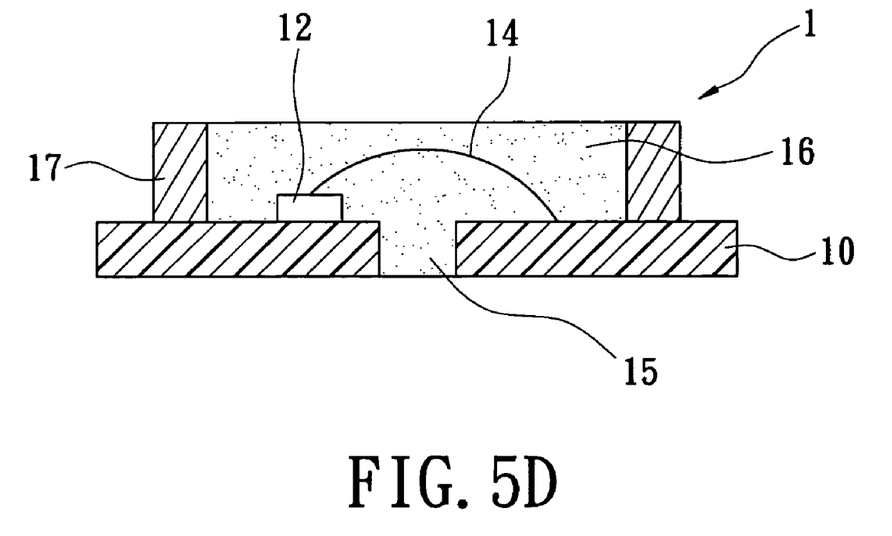
FIG. 5D shows a cross-sectional drawing of another further embodiment according to the present invention.
Figure 5E:
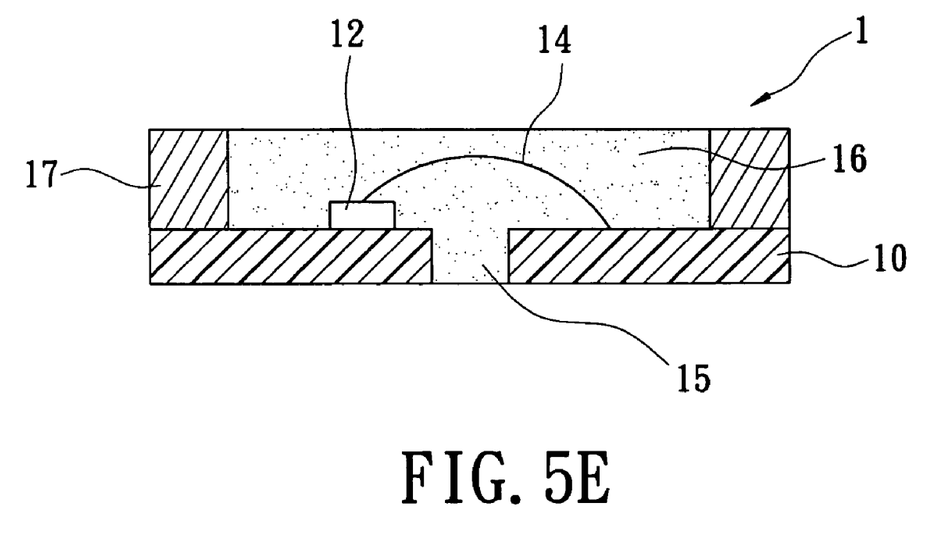
FIG. 5E shows a cross-sectional drawing of an additional embodiment according to the present invention.
Figure 6:
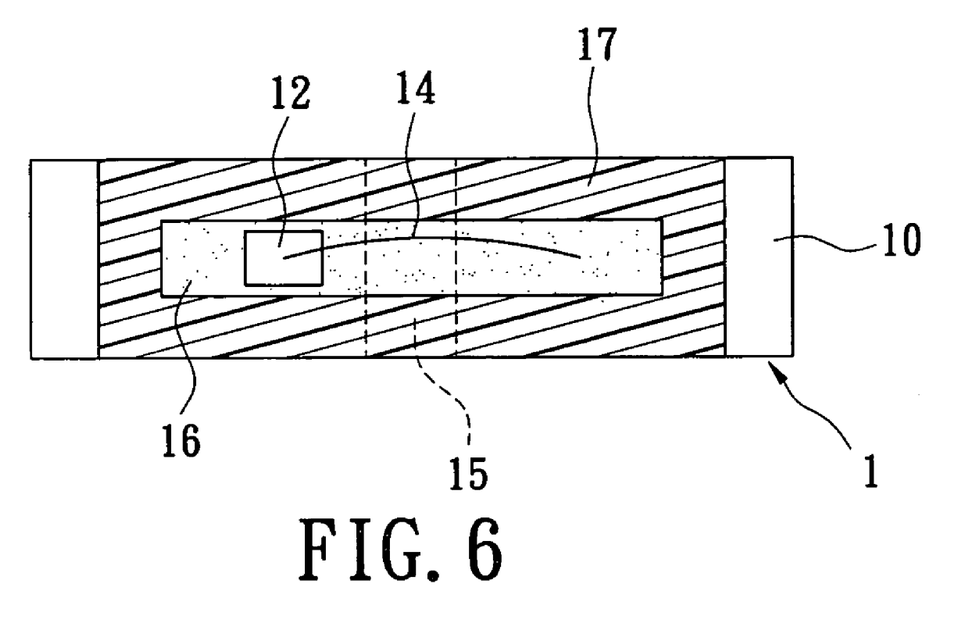
FIG. 6 shows a top view of the embodiment according to the present invention.

FIGS. 3A and 3B show a one-layer stack, FIG. 4 shows a two-layered stack and FIGS. 5A to 5E show an embodiment having an external frame device 17. In FIGS. 5D and 5E, the external frame device 17 can be made of metal and the substrate 10 also can be made of metal, while the substrate can be a stack structure, or the substrate 10 and the external frame 17 jointly form a stack structure. In the following, there is a description of a package structure 1 for a semiconductor (such as a light-emitting diode or a photo-detector) according to the present invention. A substrate 10 has an obverse side (generally, there is an emitter disposed thereon) and a reverse side. An emitter 12 such as, for example, a semiconductor, such as, for example, an LED or a photo-detector, is disposed on the obverse side or the reverse side of the substrate 10 and has a conducting line 14 for connecting two sections of the substrate 10 to each other across a thin trench 15. An external frame device 17, the material of which can be a metal or a prefabricated frame, is made of an opaque material and is mounted on the substrate to surround the emitter chip. A polymer filler 16 that is pervious to light, such as a polymer material having a strong penetrating ability such as, for example, a resin, fills the interior of the external frame device. A general structure of the present invention can be seen with reference to FIG. 2 (cross-sectional side view) and FIG. 6 (top view).

Following is a description of the embodiment according to the present invention in detail. According to the present invention, the substrate 10 can be a two-layered stack structure (as shown in FIG. 2), which is an important characteristic of the present invention, for strengthening the structure and making the thin trench narrow and deep. Moreover, the emitter 12 can be an LED and the emitter 12 also can be a light source. In general, the external frame device 17 is made of a polymer composite material advantageous to prevent external light interference and to condense light. That is, scattering light is upwardly condensed. Furthermore, as shown in FIG. 4, one side of the substrate opposite the other side disposed by the polymer filler 16 also has a polymer material 18. This is a double-layered structure; one layer is the polymer material 18, and the other layer is the substrate 10. Further, the substrate 10 can have a thin trench 15 with a width ranging between 0.001 mm and 10 mm. The thin trench 15 is formed through a chemical etching, and further, the substrate 10 has a thickness ranging between 0.001 mm and 10 mm. In addition, the polymer filler can be a resin, the substrate and the external frame can both be made of metal material, the side edge of the external frame device 17 and also the side edge of the substrate 10 match each other to form a uniform surface, and the substrate and the external frame device are formed integrally in one piece.

The package structure for a semiconductor according to the present invention includes the substrate 10 made of a multi-layered metal material and having an obverse side and a reverse side; a semiconductor such as, for example, an LED or photo-detector, disposed on the obverse or reverse side of the substrate 10; and the polymer filler 16 pervious to light and disposed outside the semiconductor to contain the same. Conversely, the present invention includes the substrate 10 having an obverse side and a reverse side; a semiconductor, which can be an optoelectronic semiconductor with an optoelectronic ability and disposed on the obverse or reverse side of the substrate 10; the external frame device 17 made of an opaque material and mounted on the substrate to surround the semiconductor; and the polymer filler 16 pervious to light and disposed outside the semiconductor to contain the same. The optoelectronic semiconductor can be an LED or photo-detector. Alternatively, another embodiment according to the present invention can be a package structure for a semiconductor, including a substrate having an obverse side and a reverse side; a semiconductor disposed on the obverse or reverse side of the substrate 10; the external frame device 17 made of an opaque material and mounted on the substrate 10 to surround the semiconductor; and the polymer filler 16 pervious to light and disposed outside the semiconductor to contain the same.

The characteristics and convenience of the present invention are that the conventional one-layer substrate package has been changed to a two-layered structure and an external frame device 17 is additionally provided. The altered package structure may have an improved mechanical strength and an enhanced illumination, a lower cost, and a manufacturing procedure only slightly different from that of the conventional LED package.

It should be noted that the mechanical equipment for the two-layered structure and the addition of the external frame device 17 are not expensive or difficult to acquire, and further, the substrate structure of the present invention takes into consideration both the illumination and structural strength. Furthermore, since the manufacturing procedure of the conventional LED package is only slightly changed, the present invention can be completely integrated into the old package procedure without substantially modifying the package machine so as to conform to actual manufacturing conditions.

The present invention is advantageous in that: (1) the new manufacturing procedure is easily set up and the price and technical requirement of the additionally purchased equipment are both low; (2) the structural strength of the substrate is preferred; (3) the conventional package equipment is still usable; and (4) the illumination is great and can be conformed to conventional packaging procedures.

As can be seen from the above, the package structure for a semiconductor according to the present invention, which exactly resolves the defects in the prior art, is really a product with a highly practical value and also has an increment of efficiency.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A package structure comprising:
    a) at least two substrates forming a multi-stack structure, each substrate of the at least two substrates has a trench formed through the substrate, the trench of each substrate of the at least two substrates has a width directly proportional to a thickness of the substrate, when the thickness is reduced the width is reduced;
    b) a semiconductor located on a top substrate of the at least two substrates;
    c) an external frame device made of an opaque material and mounted on the top substrate surrounding the semiconductor; and
    d) a polymer filler pervious to light and filling an interior of the external frame device.

2. The package structure for a semiconductor as claimed in claim 1, wherein the semiconductor is a device selected from a group consisting of a light-emitting diode and a photo-detector.

3. The package structure for a semiconductor as claimed in claim 1, wherein the external frame device is made of a polymer composite material.

4. The package structure for a semiconductor as claimed in claim 1, further comprising a polymer composite material located on an opposite surface from the polymer filler.

5. The package structure for a semiconductor as claimed in claim 1, wherein the trench has a width between 0.001 mm and 10 mm.

6. The package structure for a semiconductor as claimed in claim 1, wherein the trench of each of the at least two substrates is formed by etching.

7. The package structure for a semiconductor as claimed in claim 1, wherein each of the at least two substrates and the external frame device are made of metal material.

8. The package structure for a semiconductor as claimed in claim 1, wherein four exterior side surfaces of the external frame device aligning with four exterior side surfaces of each of the at least two substrates.

9. The package structure for a semiconductor as claimed in claim 1, wherein each substrate of the at least two substrates is made of a same metal material.

10. The package structure for a semiconductor as claimed in claim 1, wherein each of the at least two substrates is made of a metal material and has a thickness between 0.01 mm and 10 mm.

11. The package structure for a semiconductor as claimed in claim 1, wherein the width of the trench of each substrate of the at least two substrates is equal to the thickness of the substrate.

12. A package structure comprising:
a) at least two substrates forming a multi-stack structure, each substrate of the at least two substrates has a trench formed through the substrate, the trench of each substrate of the at least two substrates has a width directly proportional to a thickness of the substrate, when the thickness is reduced the width is reduced;
b) a semiconductor located on a top substrate of the at least two substrates; and
c) a polymer filler pervious to light and covering the semiconductor,
wherein each substrate of the at least two substrates is made of a metal material.

13. The package structure for a semiconductor as claimed in claim 12, wherein the substrate each substrate of the at least two substrates has a thickness between 0.01 mm and 10 mm.

14. The package structure for a semiconductor as claimed in claim 12, wherein each substrate of the at least two substrates has a thickness between 0.05 mm and 10 mm.

15. The package structure for a semiconductor as claimed in claim 12, wherein the semiconductor is a device selected from a group consisting of a light-emitting diode and a photo-detector.

16. The package structure for a semiconductor as claimed in claim 12, wherein the width of the trench of each substrate of the at least two substrates is equal to the thickness of the substrate.

* * * * *